(12) United States Patent
Liao et al.

(10) Patent No.: US 9,219,120 B2
(45) Date of Patent: Dec. 22, 2015

(54) SEMICONDUCTOR FILM WITH ADHESION LAYER AND METHOD FOR FORMING THE SAME

(71) Applicant: Taiwan Semiconductor Manufacturing Company, Ltd., Hsin-Chu (TW)

(72) Inventors: Chi-Ming Liao, Hsin-Chu (TW); Chun-Heng Chen, Hsin-Chu (TW); Sheng-Po Wu, Zhongli (TW); Ming-Feng Hsieh, New Taipei (TW); Hongfa Luan, Baoshan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/054,483

(22) Filed: Oct. 15, 2013

(65) Prior Publication Data
US 2015/0102470 A1    Apr. 16, 2015

(51) Int. Cl.
| | |
|---|---|
| *H01L 21/762* | (2006.01) |
| *H01L 27/12* | (2006.01) |
| *H01L 29/66* | (2006.01) |
| *H01L 29/06* | (2006.01) |
| *H01L 21/02* | (2006.01) |

(52) U.S. Cl.
CPC ........ *H01L 29/0684* (2013.01); *H01L 21/0262* (2013.01); *H01L 21/02123* (2013.01); *H01L 21/02381* (2013.01); *H01L 21/02488* (2013.01); *H01L 21/02502* (2013.01); *H01L 21/02532* (2013.01); *H01L 21/7624* (2013.01); *H01L 21/76243* (2013.01); *H01L 27/1203* (2013.01); *H01L 29/6678* (2013.01)

(58) Field of Classification Search
CPC .................... H01L 21/7624; H01L 21/76243; H01L 27/1203; H01L 29/6678
See application file for complete search history.

(56) References Cited

U.S. PATENT DOCUMENTS

| | | | | |
|---|---|---|---|---|
| 6,858,898 | B1 * | 2/2005 | Hayakawa et al. | 257/347 |
| 2001/0004121 | A1 * | 6/2001 | Sakama et al. | 257/347 |

* cited by examiner

*Primary Examiner* — Phat X Cao
(74) *Attorney, Agent, or Firm* — Slater & Matsil, L.L.P.

(57) ABSTRACT

Presented herein is a method for forming a semiconductor film using an adhesion layer, comprising providing an oxide layer disposed over a substrate, forming at least one adhesion layer over the oxide layer, and forming a film layer over the at least one adhesion layer in a same process step as the forming the at least one adhesion layer. Forming the at least one adhesion layer further comprises at least forming a first adhesion layer over the oxide layer and forming a second adhesion layer over the first adhesion layer. Forming the first adhesion layer comprises providing the terminating gas at a substantially constant first flow rate, and wherein the forming the second adhesion layer comprises ramping a flow rate of the terminating gas to a zero flow rate from the first flow rate.

20 Claims, 11 Drawing Sheets

SEMICONDUCTOR FILM WITH ADHESION LAYER AND METHOD FOR FORMING THE SAME

BACKGROUND

Conventional semiconductor devices are typically formed in a bulk substrate or a semiconductor material such as silicon, gallium arsenide, germanium or the like. Recently, devices formed from film layers with mismatched atomic lattice structures have been used to engineer the properties of the film layer materials. This approach has been used to form semiconductor layers over an insulator to separate the active layer from the bulk of the semiconductor wafer. For example, silicon-on-insulator (SOI) semiconductor devices typically have a thin layer of silicon, also known as the active layer, on an insulator layer such as a buried oxide (BOX) layer. Active devices, such as MOS transistors (MOSFETs), are formed in active regions within the active layer and are isolated from the substrate by the BOX layer. In other examples, film layers such as oxides, nitrides, oxynitrides, carbides or the like may be formed over conductors, semiconductors or insulators to provide structures with electrical insulation, physical barriers, fabrication masks, protective layers or the like.

Devices formed on films on substrates exhibit many improved performance characteristics over their bulk substrate counterparts. SOI substrates, for example, are particularly useful in reducing problems relating to reverse body effects, device latch-up, soft-error rates, and junction capacitance. Such SOI technology therefore enables higher speed performance, higher packing density, and reduced power consumption. However, structures with film based elements are not limited to SOI structures, as any suitable material may be formed from a film over a structure such as a substrate, base, carrier, support or other underlying structure.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2A-7 are cross-sectional views of intermediate steps in processes for forming adhesion layers and devices with adhesion layers according to various embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the illustrative embodiments are discussed in detail below. It should be appreciated, however, that the present disclosure provides many applicable concepts that can be embodied in a wide variety of specific contexts. The specific embodiments discussed are merely illustrative of specific ways to make and use the embodiments of the disclosure, and do not limit the scope of the disclosure.

The present disclosure describes embodiments with regard to a specific context, namely forming an adhesion layer over an oxide and deposition of a semiconductor SOI layer. The embodiments of the disclosure may also be applied, however, to a variety of epitaxy scenarios, devices, wafer bonding processes or other semiconductor processing techniques. Hereinafter, various embodiments will be explained in detail with reference to the accompanying drawings.

Semiconductor on insulator structures are commonly formed having an oxide layer on a substrate with a semiconductor layer epitaxially grown over the oxide. While the techniques described herein are referred to as applying to SOI technology, it should be understood that the presented embodiments are not limited to silicon, and may be applied to any semiconductor on insulator technique. In various embodiments, the semiconductor film is silicon, germanium, gallium arsenide, gallium antimonide, indium arsenide, or another material. Active devices may be formed in the semiconductor film, with the oxide separating the film from the bulk substrate.

Disclosed herein is a method for reducing defects in the bond between the oxide and the semiconductor film layer. One or more adhesion layers are formed on the oxide prior to formation of the semiconductor film layer. The adhesion layer is formed by introducing oxygen into the film formation chamber to form an oxide of the film precursor. The oxygen displaces residual atoms or contaminants at the oxide surface that may be introduced by the precursor. The oxygen flow is then stopped, or reduced to a second, lower flow rate, with the precursor still flowing to form the film layer. Thus, the adhesion layer and film layer are formed in a single process step, preventing other impurities from contaminating the interface between the adhesion layer and the film layer.

Figure 1A:
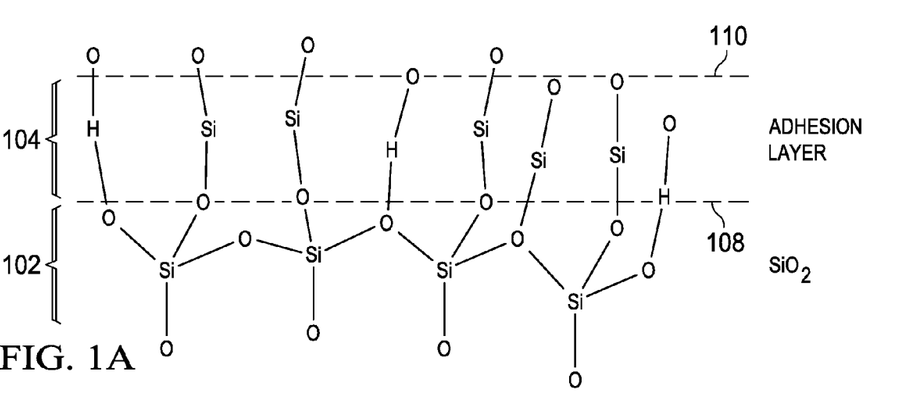
FIGS. 1A-1B are diagrams illustrating the structure of an adhesion layer on an oxide layer according to an embodiment.

FIG. 1A illustrates the molecular structure of an adhesion layer 104 on an oxide layer 102 according to an embodiment. In an embodiment, the oxide layer 102 is silicon dioxide ($SiO_2$), and the adhesion layer 104 is formed from silicon. The subsequent semiconductor film layer 106 (See, e.g., FIG. 1B) is formed with a silicon precursor such as disilane ($Si_2H_6$), or a higher silane such as trisilane ($Si_3H_8$), silicobutane ($Si_4H_{10}$) or the like. In other embodiments, the adhesion layer is formed with germanium using germane (GeH) or higher germane such as digermane ($Ge_2H_6$) or the like, or is formed with of semiconductor such as gallium arsenide (GaAs), silicon germanium (SiGe) or the like.

A terminating gas such as oxygen displaces the hydrogen introduced by the silane during formation of the adhesion layer 104. An oxygen terminating gas results in silicon-to-oxygen bonds (Si—O) or hydrogen-to-oxygen bonds (H—O) at the interface 108 between the oxide layer 102 and the adhesion layer 104, reducing the number of silicon-to-hydrogen bonds (Si—H) at the interface 108. Thus, the Si—O and H—O bonds predominate over the S—H bonds at the interface 108. The oxygen processing gas terminates the adhesion layer 104 with oxygen in Si—O and H—O bonds at the adhesion layer surface 110. The Si—O and H—O bonds are stronger than Si—H bonds, with a bond energy of 452 kJ/mol for Si—O and 467 kJ/mol for H—O compared to 393 kJ/mol for Si—H. The relatively weak Si—H bond also create desorbption after thermal annealing, requiring higher thermal budgets to prevent failure of bonds at the interface 108. Additionally, providing oxygen during the adhesion layer 104 formation reduces the need for a precursor decomposition material such as mercury, resulting in fewer residual contaminants in the processing system.

Figure 1B:
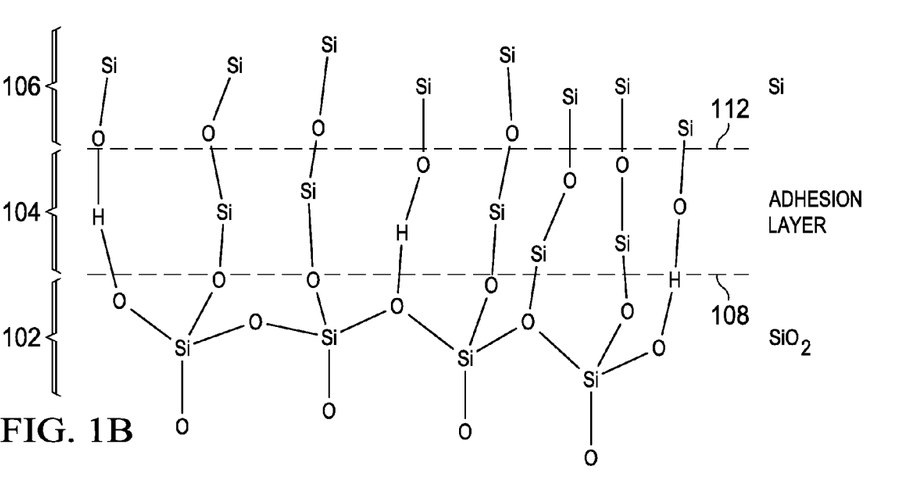

FIG. 1B illustrates the molecular structure of a film layer 106 on the adhesion layer 104 according to an embodiment.

The adhesion layer 104 is terminated by oxygen, and the film layer 106 is formed in a continuous step with the oxygen flow terminated. The precursor deposits the film layer 106 with the semiconductor attaching to the oxygen at the adhesion layer surface 110 (FIG. 1A) resulting in S—O bonds that are stronger than the S—H bonds. Thus, the bond between the film layer 106 and the oxide layer 102 is stronger than if the bond had predominantly S—H bonds. The stronger bonds reduce peeling of the film layer 106 from the oxide layer 102. The film layer 106 and adhesion layer 104 are formed at lower temperatures than forming the film layer 106 directly on the oxide layer 102, resulting in a lower thermal budget, particularly in fabrication processes where additional channel materials, such as III-V materials, silicon-germanium (SiGe) or germanium are formed in the film layer. Additionally, forming the adhesion layer 104 and film layer 106 in a single process step uses a single precursor for both the adhesion layer 104 and the film layer 106, eliminating the time required to switch processes between different precursors. Thus, the adhesion layer 104 and film layer 106 each comprise at least a material or element from the precursor.

Figure 2A:
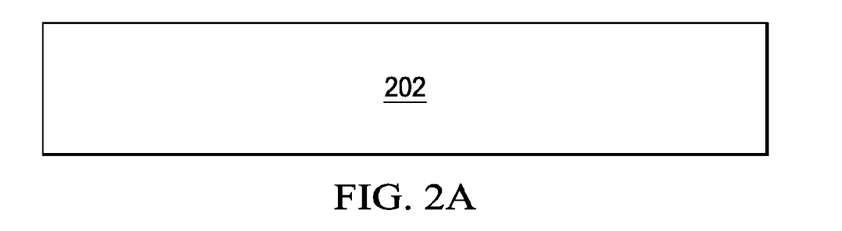

FIGS. 2A through 2E illustrate intermediate steps in forming a film layer over an adhesion layer according to an embodiment. FIG. 2A illustrates an initial step in forming a semiconductor film layer on a substrate 202 according to an embodiment. A substrate 202 such as a bulk semiconductor wafer, a carrier, an insulating wafer or another supporting structure is provided. In an embodiment, the substrate 202 is silicon or another semiconductor material.

Figure 2B:
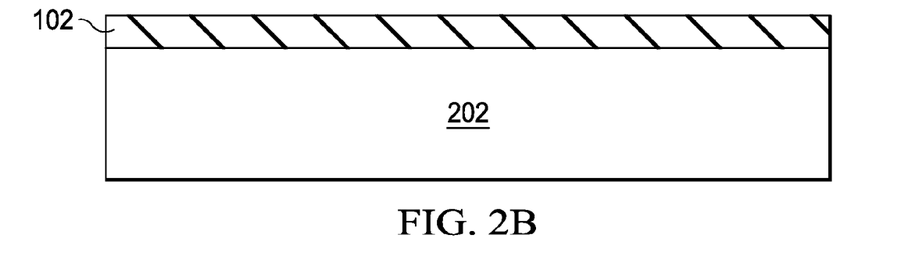

FIG. 2B is a cross-sectional view illustrating formation of an oxide layer 102 over the substrate 202 according to an embodiment. The oxide layer 102 is formed, in an embodiment, by thermal oxide growth, a spin-on glass process, through chemical vapor deposition (CVD), low pressure CVD (LPCVD), plasma enhanced CVD (PECVD), or another oxide formation process. In an embodiment, the oxide is $SiO_2$, formed to a thickness between about 10 angstroms and about 3000 angstroms. In another embodiment, the oxide layer 102 is germanium oxide ($GeO_2$) or another oxide, carbide, nitride, oxynitride or other insulating material.

Figure 2C:
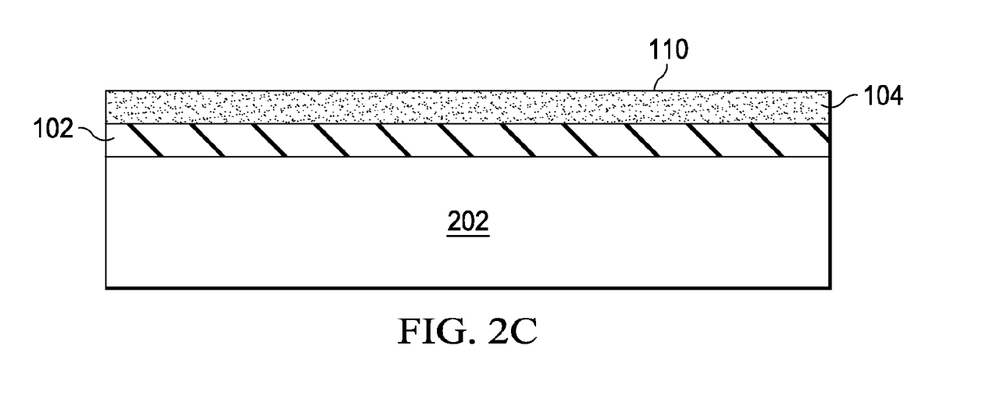

FIG. 2C is a cross-sectional view illustrating formation of an adhesion layer 104 on the oxide layer 102 according to an embodiment. In an embodiment, the adhesion layer 104 is formed by CVD on the oxide layer 102. A semiconductor film precursor is introduced with a terminating gas, such oxygen, into a CVD chamber housing the workpiece having the oxide layer 102.

Figure 2D:
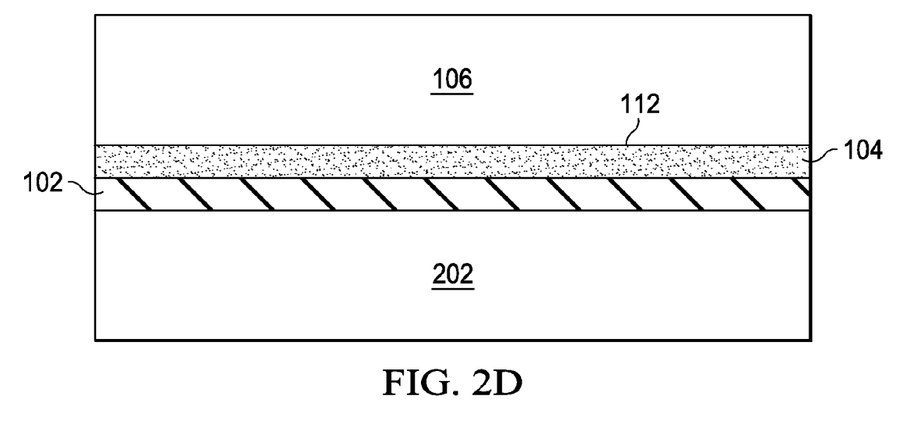

FIG. 2D is a cross-sectional view illustrating formation of a film layer 106 on the adhesion layer 104 according to an embodiment. After formation of the adhesion layer 104, the terminating gas flow into the CVD chamber and the film layer 106 is formed by maintaining the precursor gas flow into the CVD chamber maintained at a substantially constant processing temperature.

Figure 3:
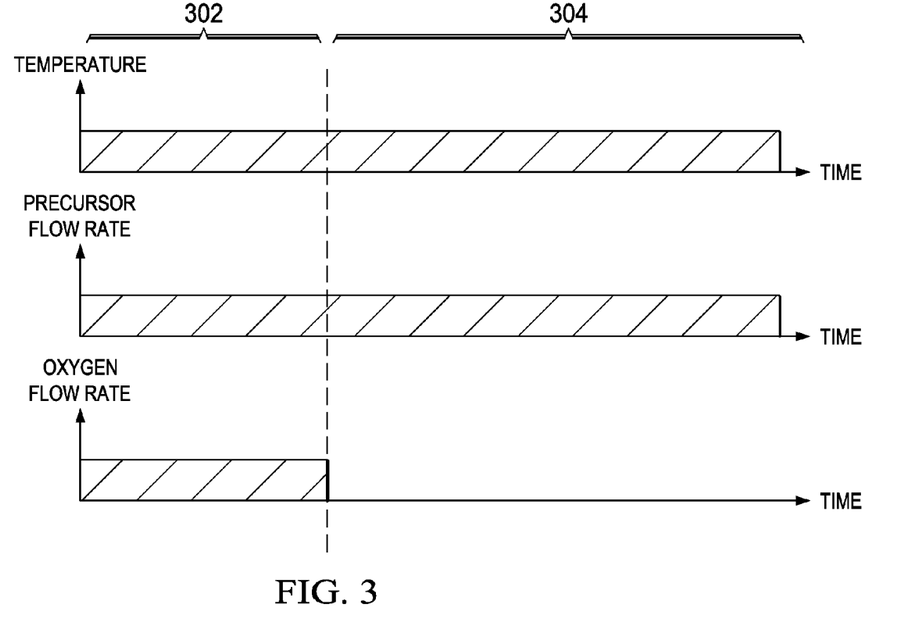

FIG. 3 illustrates the relationship between the flow rate of the terminating gas, the precursor and the temperature of the CVD environment during the adhesion layer formation period 302 and the film layer formation period 304. In an embodiment, the terminating gas is oxygen, and is maintained at a flow rate between about 10 sccm and about 2000 sccm during the adhesion layer formation period 302 to form the adhesion layer 104 to a thickness between about 10 angstroms and about 300 angstroms. In such an embodiment, the precursor is disilane maintained at a flow rate between about 100 sccm and about 2000 sccm during the adhesion layer formation period 302 and the film layer formation period 304. The CVD environment is maintained at a temperature between about 300° C. and about 600° C. during the adhesion layer formation period 302 and the film layer formation period 304.

Figure 2E:
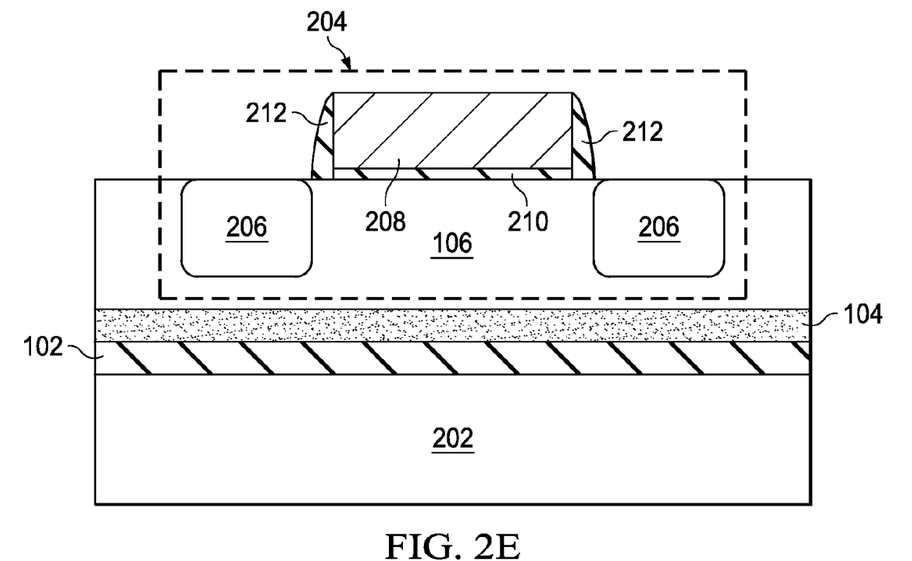

FIG. 2E is a cross sectional view illustrating a transistor 204 formed in the film layer 106 according to an embodiment. Source/drain regions 206 are formed in the film layer 106, and a gate stack having a gate oxide 210 and gate contact 208 disposed over the film layer 106 and between gate spacers 212.

Figure 4A:
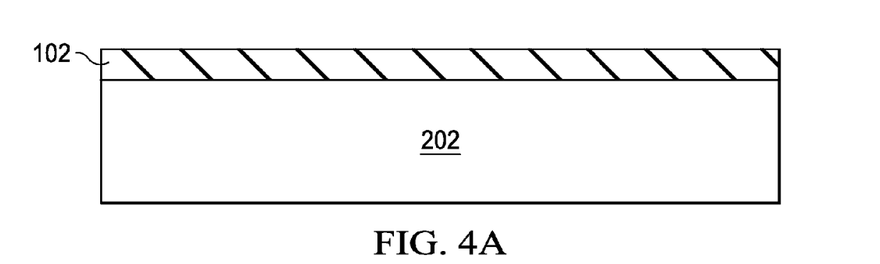

FIGS. 4A through 4E illustrate intermediate steps in forming a film layer over multiple adhesion layers according to an embodiment. FIG. 4A illustrates an initial step in forming a semiconductor film layer on a substrate 202 according to another embodiment. An oxide layer 102 is initially formed on a substrate 202.

Figure 4B:
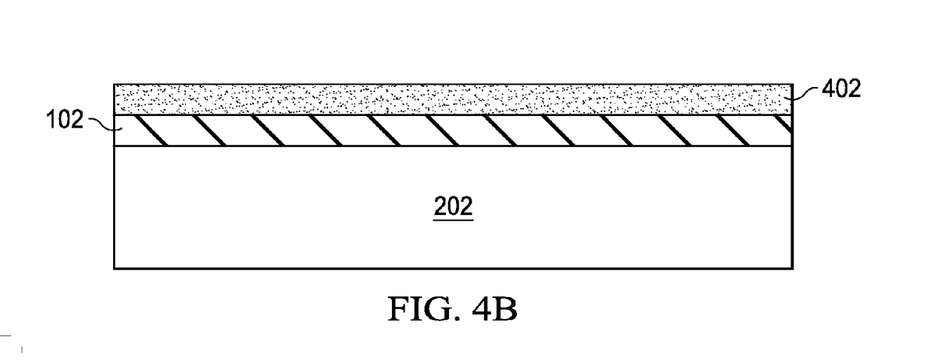

FIG. 4B is a cross-sectional view illustrating formation of a first adhesion layer 402 according to an embodiment. In an embodiment, the first adhesion layer 402 is an oxide of a precursor gas used for the subsequent film layer 106 (See, e.g., FIG. 4E). The first adhesion layer 402 is formed using a procedure similar to that described above with respect to FIG. 2C.

Figure 4C:
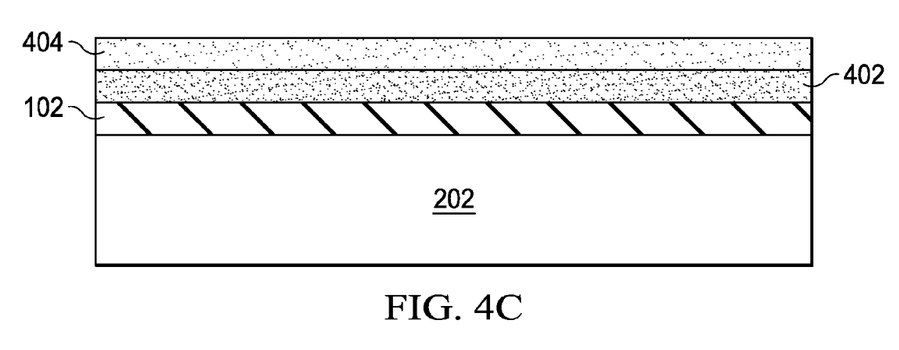

FIG. 4C is a cross-sectional view illustrating formation of a second adhesion layer 404 on the first adhesion layer 402 according to an embodiment. In such an embodiment, the second adhesion layer 404 is a stress modulation layer having a different oxygen concentration at the bottom surface than at the top surface. In such an embodiment, the second adhesion layer 404 has a lattice constant between the lattice constant of the first adhesion layer 402 and the lattice constant of an overlying layer. The second adhesion layer 404 is formed by flowing oxygen in the CVD chamber with a precursor and ramping down the oxygen flow rate in the CVD chamber while maintaining the flow rate of the precursor. This results in a second adhesion layer 404 with a lower oxygen concentration at the top surface than at the bottom surface where the second adhesion layer 404 contacts the first adhesion layer 402.

Figure 4D:
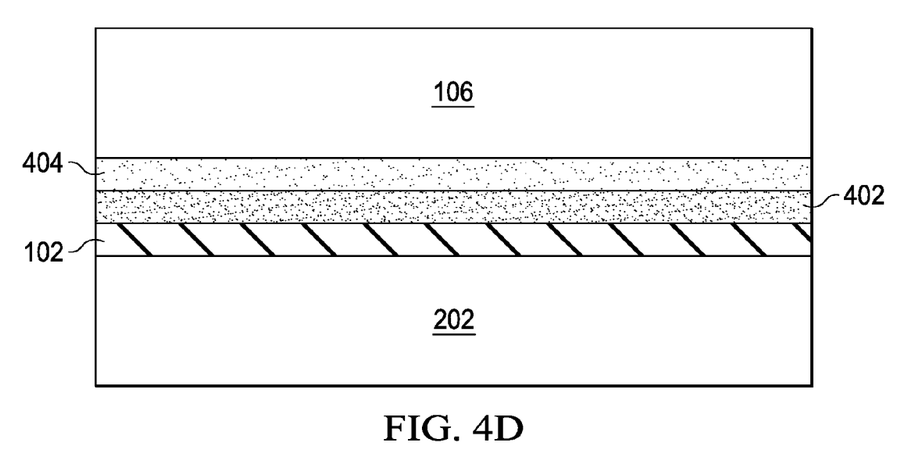

FIG. 4D is a cross-sectional view illustrating formation of the film layer 106 over the second adhesion layer 404 according to an embodiment. In such an embodiment, the terminating gas forming the second adhesion layer is 404 stopped, while the precursor gas continues flowing. In an embodiment where the precursor is silane, the film layer 106 is a silicon film over a $SiO_x$ second adhesion layer 404.

Figure 5:
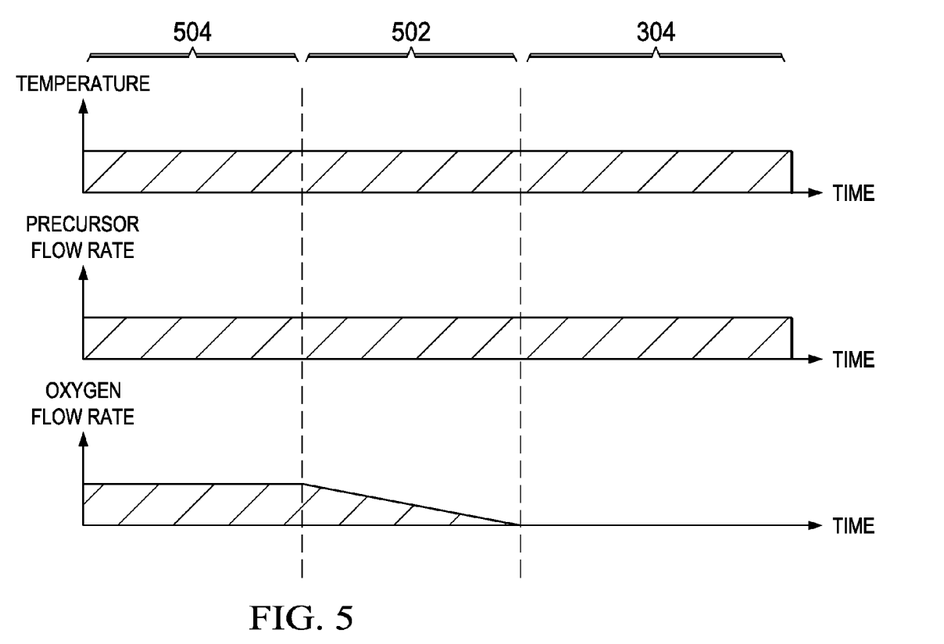

FIG. 5 illustrates the relationship between the flow rate of the terminating gas, the precursor and the temperature of the CVD environment during the first adhesion layer formation period 504, the second adhesion layer formation period 502 and the film layer formation period 304. In an embodiment, the terminating gas is oxygen, and is maintained at a flow rate between about 10 sccm and about 2000 sccm during the first adhesion layer formation period 504 to form the first adhesion layer 402 with a thickness between about 10 angstroms and about 300 angstroms. The terminating gas flow rate is then reduced during the second adhesion layer formation period 502, and is stopped at the end of the second adhesion layer formation period 502. The second adhesion layer 404 is formed with a thickness between about 10 angstroms and about 200 angstroms In such an embodiment, the precursor is silane maintained at a flow rate between about 100 sccm and about 2000 sccm during the first adhesion layer formation period 504, the second adhesion layer formation period 502 and the film layer formation period 304. The CVD environment is maintained at a temperature between about 300° C. and about 600° C.

during the first adhesion layer formation period 504, the second adhesion layer formation period 502 and the film layer formation period 304.

Figure 4E:
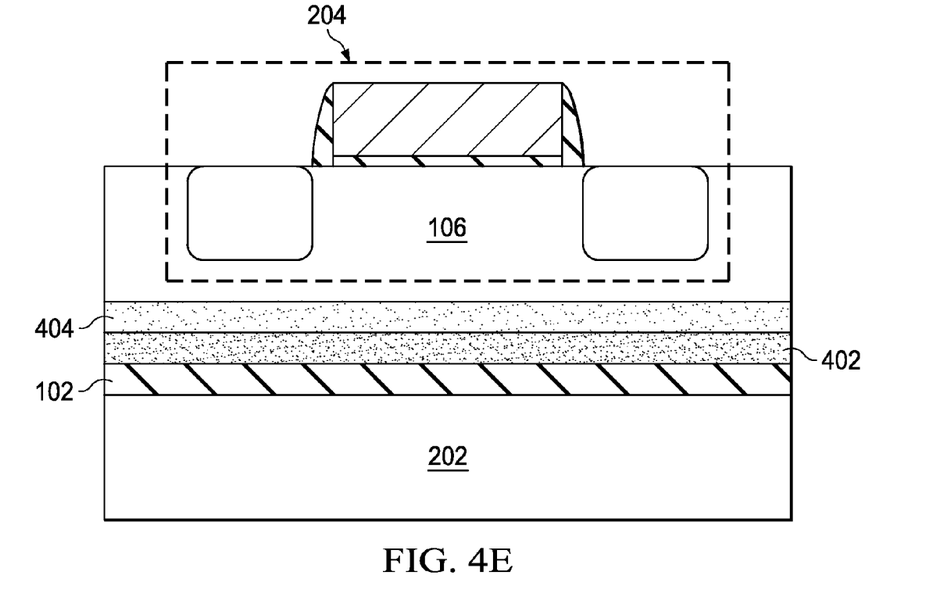

FIG. 4E is a cross-sectional diagram illustrating a transistor 204 disposed in the film layer 106. The transistor 204 is separated in the film layer 106 from the first and second adhesion layers 402 and 404. Additionally, the first and second adhesion layers 402 and 404 separate the transistor 204 from the oxide layer 102 and the substrate 202.

While the embodiments described above are referred to in terms of forming a film layer over an oxide, such embodiments are not limited solely to SOI structures. Other embodiments include formation of dummy gates for transistors formed using "gate-last" or replacement gate processes, forming FinFET structures, channel and source/drain structures, bonding wafers and other processes with semiconductor/oxide material stacks.

Figure 6A:
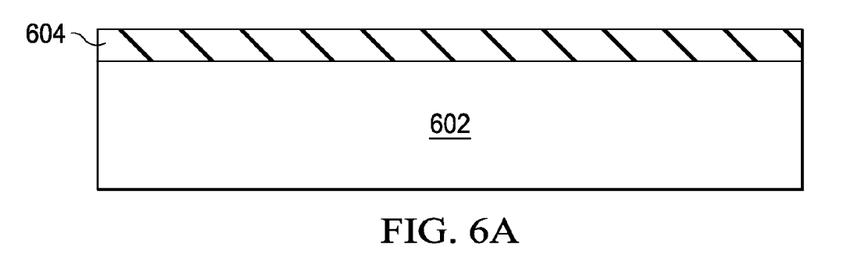

FIGS. 6A-6F and 7 illustrate formation of a transistor with a dummy gate process according to an embodiment. FIG. 6A is a cross-sectional view of an initial step in formation of a transistor according to an embodiment. A substrate 602 has an oxide layer 604 formed thereon.

Figure 6B:
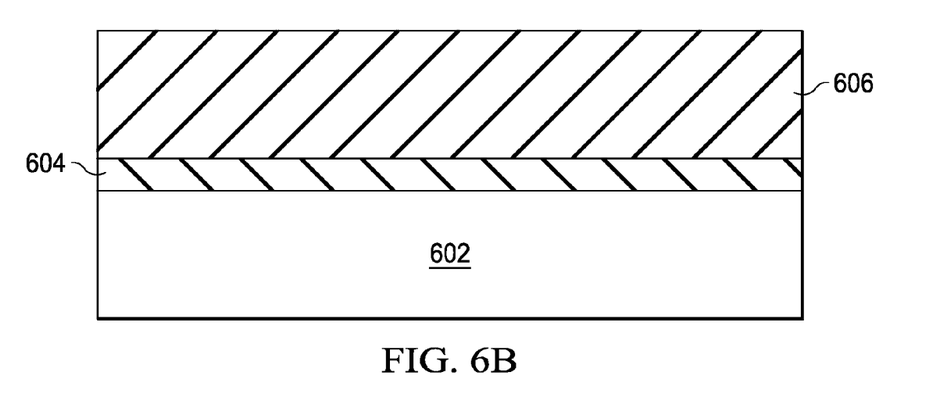

FIG. 6B is a cross-sectional view illustrating formation of a dummy gate layer 606 according to an embodiment. The dummy gate layer 606 is formed by flowing a terminating gas such as oxygen with a precursor gas into a CVD chamber to deposit the dummy gate layer 606 on the oxide layer 604. In an embodiment, the oxide layer 604 and dummy gate layer 606 may be formed in a single process step by changing the flow rate of the terminating gas to result in different compositions in the oxide layer 604 and the dummy gate layer 606. For example, in an embodiment, the oxide layer 604 is $SiO_2$ and the dummy gate layer is $SiO_x$, with the oxygen content of the dummy gate layer 606 being lower than the oxygen content of the oxide layer 604. This is accomplished by flowing the an oxygen terminating gas at a first rate during oxide layer formation and reducing the oxygen flow rate to a second, lower flow rate during dummy gate layer formation. In such an embodiment, the oxide layer 604 may act as an adhesion layer between the dummy gate layer 606 and the substrate 602.

Figure 7:
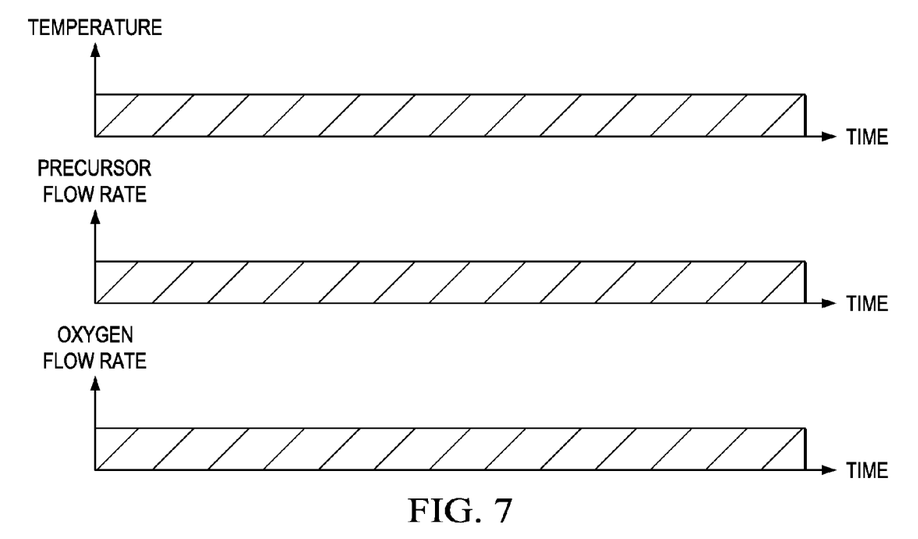

FIG. 7 illustrates the relationship between the flow rate of the terminating gas, the precursor and the temperature of the CVD environment during formation of the dummy gate layer 606. In an embodiment, the terminating gas is oxygen, and is maintained at a substantially constant flow rate during formation of the dummy gate layer 606. This rate may be different than the flow rate of oxygen during formation of the oxide layer 604. The dummy gate layer 606 is formed to a thickness between about 1000 angstroms and about 4000 angstroms. In an embodiment, the precursor is silane and is maintained at a substantially constant flow rate, with the CVD chamber maintained at a constant temperature during dummy gate layer formation.

Figure 6C:
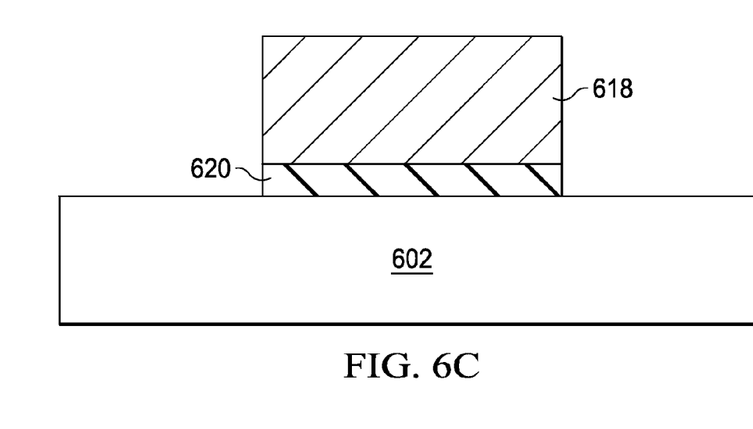

FIG. 6C illustrates patterning of the dummy gate 618 and gate oxide 620 according to an embodiment. In an embodiment, the dummy gate layer 606 and oxide layer 604 are masked and etched to define a gate region with the dummy gate 618 and gate oxide 620.

Figure 6D:
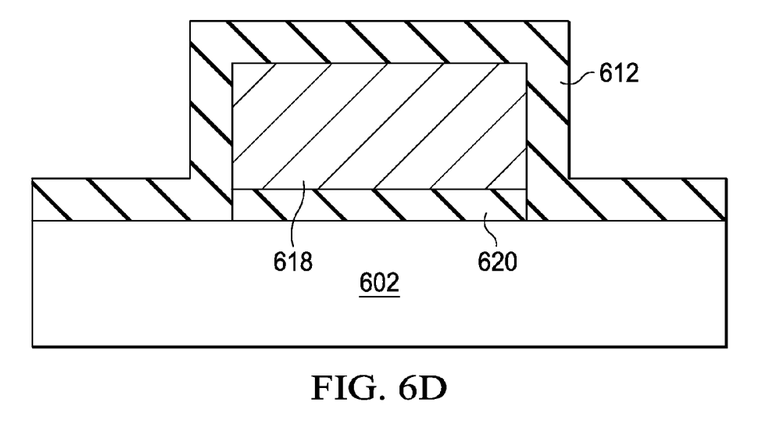
Figure 6E:
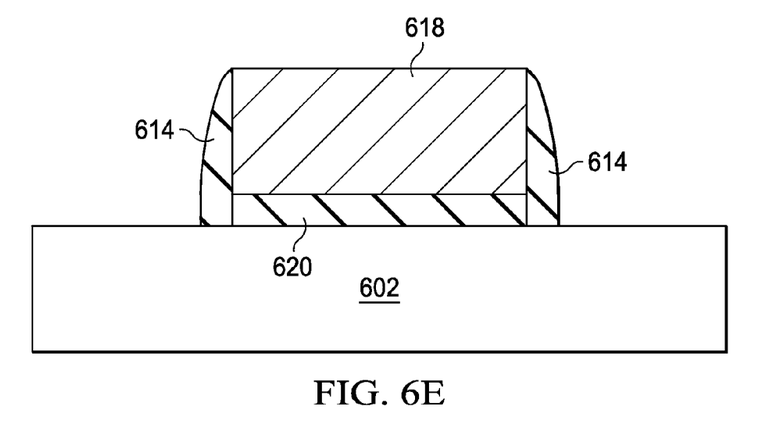

FIGS. 6D and 6E illustrate formation of gate spacers 614 according to an embodiment. A spacer layer 612 is formed over the dummy gate 618 and gate oxide 620 and then etched to form gate spacers 614 on the sidewalls of the dummy gate 618 and gate oxide 620.

Figure 6F:
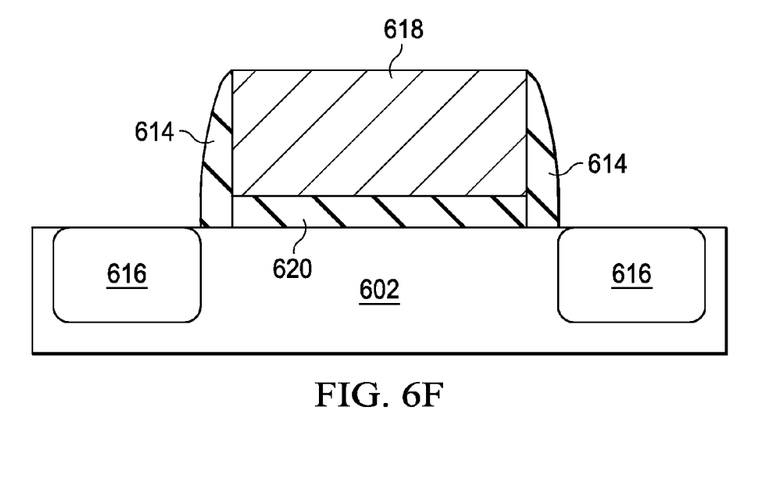
Figure 6G:
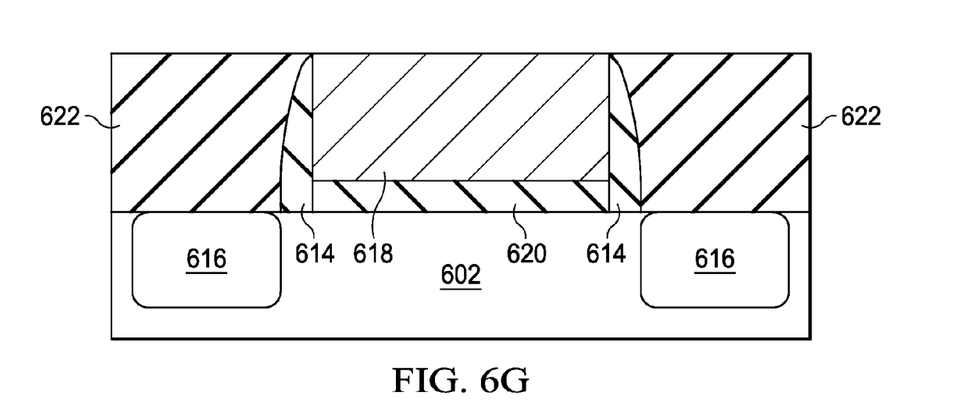

FIGS. 6F and 6G illustrate formation of source/drain regions 616 and a dielectric layer 622 according to an embodiment. One or more source/drain regions 616 are implanted or otherwise formed in the substrate 602, and a dielectric layer 622 is formed over the substrate 602. The dielectric layer 622 is planarized with the surface of the dummy gate 618.

Figure 6H:
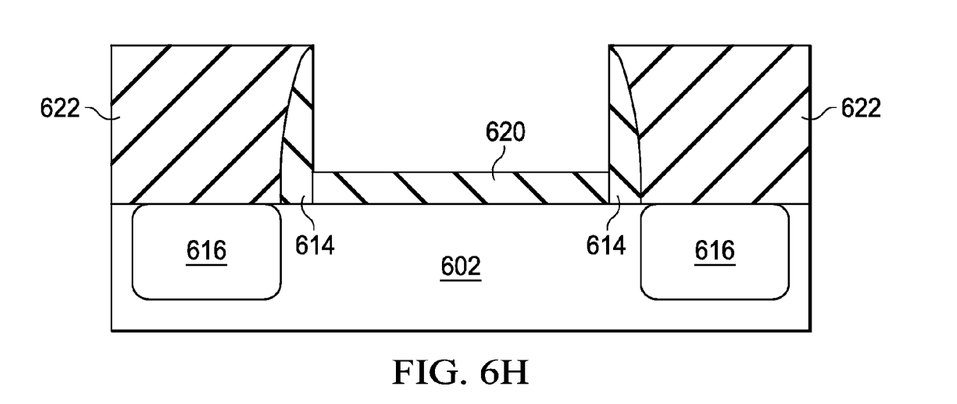

FIG. 6H illustrates removal of the dummy gate according to an embodiment. The dummy gate 618 (See, e.g., FIGS. 6C-6G) is removed to expose the gate oxide 620, by for example, elective etching or another process.

Figure 6I:
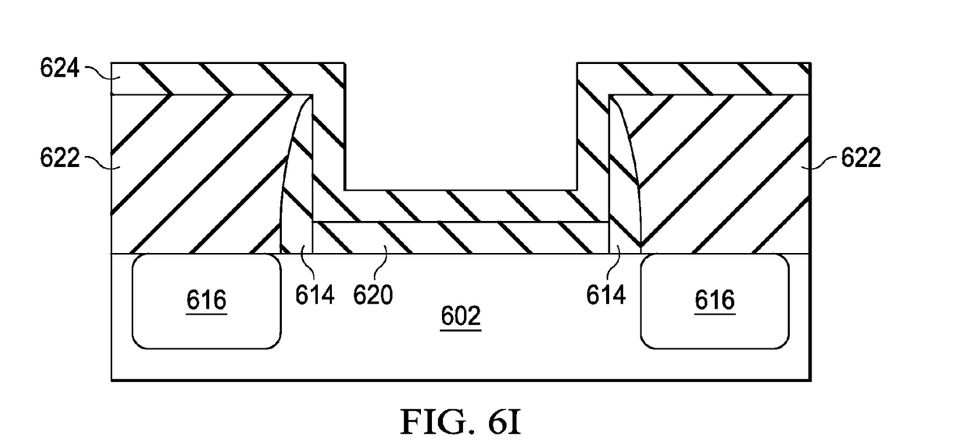
Figure 6J:
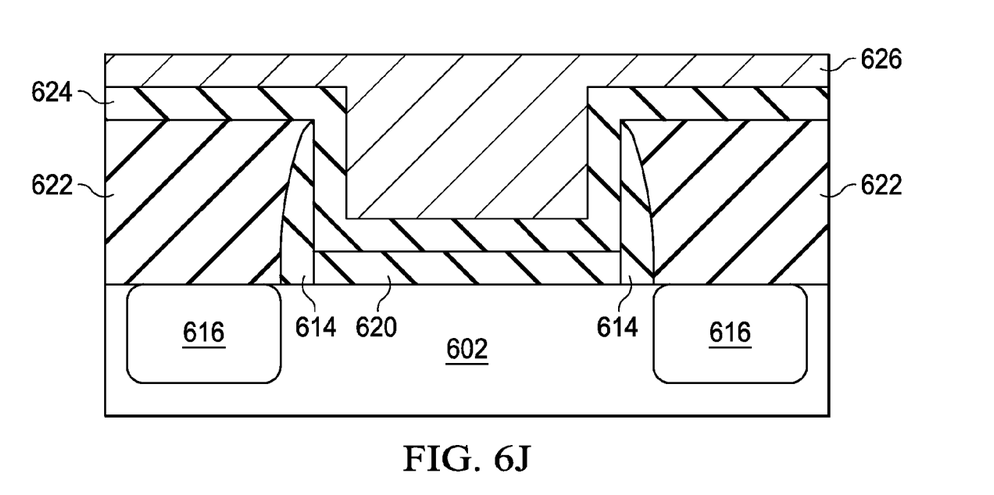

FIGS. 6I and 6J illustrate formation of the gate stack according to an embodiment. A liner layer 624 such as a diffusion barrier layer is formed in the gate opening, and a gate contact layer 626 such as polysilicon, a metal or another conductive material is formed over the liner layer 624, filling the gate region.

Figure 6K:
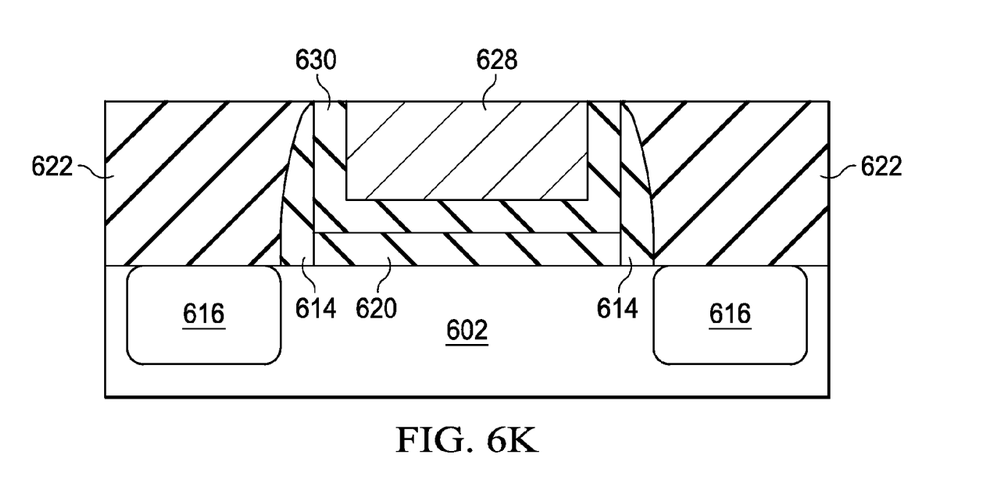

FIG. 6K illustrates formation of the liner 630 and gate contact 628 according to an embodiment. The liner layer 624 and gate contact layer 626 (See, e.g., FIGS. 6I and 6J) are planarized to remove material extending above the dielectric layer 622. Subsequent processing steps, such as silicide formation, forming redistribution layers (RDLs), contact formation, passivation, and the like may be performed.

Figure 8:
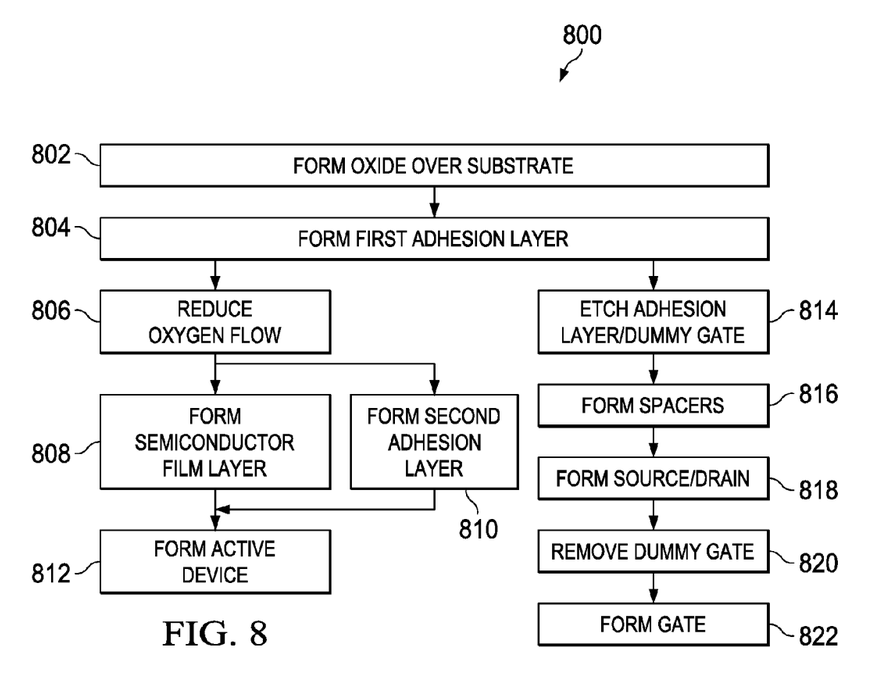
FIG. 8 is a flow diagram illustrating a method of forming an adhesion layer according to an embodiment.

FIG. 8 is a flow diagram illustrating a method 800 of forming semiconductor layers according to embodiments. An oxide layer is formed over a substrate in block 802, and a first adhesion layer is formed over the oxide layer in block 804.

In an embodiment, the oxygen flow is reduced in block 806. Where a single adhesion layer is used, the oxygen flow is reduced completely upon formation of the first adhesion layer. In another embodiment where a second adhesion layer is used, the oxygen flow is ramped down during formation of the second adhesion layer in block 810. A semiconductor film layer is formed over the topmost adhesion layer in block 808 by maintaining the precursor flow from formation of the one or more adhesion layers. One or more active devices are formed in the semiconductor film layer in block 812.

In another embodiment, the first adhesion layer is a gate oxide and the film layer is the dummy gate. After forming the first adhesion layer in block 804, the adhesion layer and dummy gate are patterned and etched in block 814. Spacers are formed on the sidewalls of the patterned dummy gate in block 816. Source/drain regions are formed in block 818, and the dummy gate removed in block 820. One or more layers provided to form the gate in block 822.

Thus, according to an embodiment, a method for forming a semiconductor film using an adhesion layer, comprising providing an oxide layer disposed over a substrate, forming at least one adhesion layer over the oxide layer, and forming a film layer over the at least one adhesion layer in a same process step as the forming the at least one adhesion layer. Forming the at least one adhesion layer comprises depositing the at least one adhesion layer using a first terminating gas, the at least one adhesion layer comprising at least a from the terminating gas. Forming the at least one adhesion layer further comprises at least an element forming a first adhesion layer over the oxide layer and forming a second adhesion layer over the first adhesion layer. Forming the first adhesion layer comprises providing the terminating gas at a substantially constant first flow rate, and wherein the forming the second adhesion layer comprises ramping a flow rate of the terminating gas to a zero flow rate from the first flow rate. In an embodiment, the terminating gas is oxygen, and the at least one adhesion layer comprises an oxide of an element in the film layer. The forming the at least one adhesion layer comprises providing at least one precursor and maintaining a flow rate of the precursor during the forming the film layer. The precursor comprises one of disilane, trisilane, silicobutane, germane or digermane. The film layer comprises at least silicon or germanium, and the at least one adhesion layer comprises an oxide of the element of the film layer. The terminating gas displaces residual atoms introduced by the precursor and predominant bonds at an interface between the oxide layer and the adhesion layer comprise an element from the terminating gas.

A method of forming a film layer with an adhesion layer according to another embodiment comprises forming at least one adhesion layer over a substrate by providing a precursor at a first flow rate and a terminating gas at a second flow rate and forming a film layer over the at least one adhesion layer in a same process step as the forming the at least one adhesion layer by stopping the flow of the terminating gas and maintaining the flow of the precursor at the second flow rate.

A device having a film layer and an adhesion layer according to an embodiment comprises an insulator layer disposed over a substrate at least one adhesion layer over the insulator layer and comprising a semiconductor element and oxygen forming a semiconductor oxide. The device further comprises a film layer over the at least one adhesion layer and comprising the semiconductor element, the film layer having a different composition than the at least one adhesion layer. Bonds at an interface between the insulator layer and the at least one adhesion layer predominantly comprise oxygen-hydrogen bonds and oxygen-semiconductor bonds. The least one adhesion layer comprises at least a first adhesion layer over the insulating layer and a second adhesion layer over the first adhesion layer. The first adhesion layer comprises oxygen at a substantially constant concentration throughout, and the second adhesion layer comprises oxygen at a concentration greatest nearest the first adhesion layer.

While the semiconductor film over adhesion layer embodiment is described herein separately from the dummy gate embodiment, the two embodiments are no mutually exclusive, and may be combined. For example, a semiconductor film layer over an adhesion layer may be created, and then a transistor may be formed using the described embodiment for forming a replacement gate. In such a combination of embodiments, the precursor and terminating gases may be the same, so that switching between process gases or equipment cleaning steps are eliminated, increasing the speed and reducing the cost of device production.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
   providing an oxide layer disposed over a substrate;
   forming at least one adhesion layer over the oxide layer using at least one precursor at a first flow rate; and
   forming a film layer over the at least one adhesion layer while maintaining the precursor at the first flow rate.

2. The method of claim 1, wherein the forming the at least one adhesion layer comprises forming the at least one adhesion layer using a first terminating gas, the at least one adhesion layer comprising at least an element from the terminating gas.

3. The method of claim 2, wherein the forming the at least one adhesion layer comprises forming a first adhesion layer over the oxide layer and forming a second adhesion layer over the first adhesion layer.

4. The method of claim 3, wherein the forming the first adhesion layer comprises providing the terminating gas at a substantially constant first flow rate, and wherein the forming the second adhesion layer comprises ramping a flow rate of the terminating gas to a zero flow rate from the first flow rate.

5. The method of claim 2, wherein the terminating gas is oxygen, and wherein the at least one adhesion layer comprises an oxide of an element in the film layer.

6. The method of claim 1, wherein the precursor comprises one of disilane, trisilane, silicobutane, germane or digermane.

7. The method of claim 6, wherein the film layer comprises at least silicon or germanium, and wherein the at least one adhesion layer comprises an oxide of an element of the film layer.

8. The method of claim 2, wherein the terminating gas displaces residual atoms introduced by the precursor and wherein predominant bonds at an interface between the oxide layer and the adhesion layer comprise an element from the terminating gas.

9. A method, comprising:
   forming at least one adhesion layer over a substrate by providing a precursor at a first flow rate and a terminating gas at a second flow rate; and
   forming a film layer over the at least one adhesion layer in a same process step as the forming the at least one adhesion layer by stopping a flow of the terminating gas and maintaining a flow of the precursor at the first flow rate.

10. The method of claim 9, wherein the at least one adhesion layer comprises at least an element from the terminating gas.

11. The method of claim 10, wherein the terminating gas is oxygen, and wherein the at least one adhesion layer comprises an oxide of an element of the film layer.

12. The method of claim 9, wherein the substrate comprises an insulator.

13. The method of claim 9, wherein the forming the at least one adhesion layer further comprises at least forming a first adhesion layer over the substrate and forming a second adhesion layer over the first adhesion layer.

14. The method of claim 13, wherein the forming first adhesion layer comprises providing the terminating gas at a substantially constant second flow rate, and wherein the forming the second adhesion layer comprises changing the flow rate of the terminating gas to at least a third flow rate less than the second flow rate, and further comprising maintaining the first flow rate of the precursor at a substantially constant first flow rate during the forming the first adhesion layer through the forming the second adhesion layer.

15. The method of claim 9, wherein the terminating gas displaces residual atoms introduced by the precursor and wherein predominant bonds at an interface between the substrate and the adhesion layer comprise an element from the terminating gas.

16. The method of claim 9, further comprising forming at least one active device extending into the film layer.

17. A method, comprising:
flowing over an oxide layer a precursor gas at a first flow rate and a terminating gas at a second flow rate to form a first adhesion film layer;
continuing to flow the precursor gas at the first flow rate while ramping down the second flow rate for the terminating gas to form a second adhesion film layer; and
continuing to flow the precursor gas at the first flow rate while eliminating the flow of the terminating gas to form a film layer.

18. The method of claim 17, wherein the precursor gas is a silicon containing gas and the terminating gas is oxygen.

19. The method of claim 17, wherein the film layer is a material selected from the group consisting of silicon, germanium, gallium arsenide, and silicon germanium.

20. The method of claim 17, further comprising forming at least one active device extending into the film layer.

\* \* \* \* \*